(12) United States Patent
Kadosh et al.

(10) Patent No.: US 6,777,281 B1
(45) Date of Patent: Aug. 17, 2004

(54) MAINTAINING LDD SERIES RESISTANCE OF MOS TRANSISTORS BY RETARDING DOPANT SEGREGATION

(75) Inventors: Daniel Kadosh, Austin, TX (US); Scott D. Luning, Dresden (DE); Akif Sultan, Austin, TX (US); David Wu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 8 days.

(21) Appl. No.: 10/214,361

(22) Filed: Aug. 8, 2002

(51) Int. Cl.[7] .................... H01L 21/8238; H01L 21/336
(52) U.S. Cl. ................ 438/199; 438/287; 438/289; 438/303
(58) Field of Search ................. 438/199, 230, 438/286, 287, 289, 303, 585, 296

(56) References Cited

U.S. PATENT DOCUMENTS

| | | | | |
|---|---|---|---|---|
| 5,911,103 A | * | 6/1999 | Yamashita et al. | 438/199 |
| 5,937,301 A | * | 8/1999 | Gardner et al. | 438/303 |
| 5,985,737 A | * | 11/1999 | Wu | 438/448 |
| 6,093,610 A | * | 7/2000 | Rodder | 438/289 |
| 6,093,611 A | | 7/2000 | Gardner et al. | |
| 6,110,790 A | | 8/2000 | Chen | |
| 6,156,598 A | | 12/2000 | Zhou et al. | |
| 6,159,783 A | * | 12/2000 | Yamashita et al. | 438/199 |
| 6,200,863 B1 | * | 3/2001 | Xiang et al. | 438/286 |
| 6,227,730 B1 | | 5/2001 | Yorozu et al. | |
| 6,232,187 B1 | * | 5/2001 | Kuroi et al. | 438/287 |
| 6,232,641 B1 | * | 5/2001 | Miyano et al. | 257/382 |
| 6,235,600 B1 | * | 5/2001 | Chiang et al. | 438/305 |
| 6,287,906 B1 | * | 9/2001 | Yamashita et al. | 438/199 |
| 6,333,232 B1 | * | 12/2001 | Kunikiyo | 438/296 |
| 6,432,817 B1 | * | 8/2002 | Bertrand et al. | 438/651 |
| 6,541,866 B1 | * | 4/2003 | Bertrand et al. | 257/766 |
| 6,545,370 B1 | * | 4/2003 | Ngo et al. | 438/230 |
| 6,593,198 B2 | * | 7/2003 | Segawa | 438/303 |
| 6,620,714 B2 | * | 9/2003 | Su et al. | 438/585 |
| 6,639,264 B1 | * | 10/2003 | Loh | 438/386 |
| 2001/0010962 A1 | | 8/2001 | Chen et al. | |

* cited by examiner

*Primary Examiner*—John F. Niebling
*Assistant Examiner*—Walter L. Lindsay, Jr.

(57) ABSTRACT

A method of manufacturing a semiconductor device, comprising steps of:

(a) providing a semi conductor substrate including at least one dopant species-containing region extending to a surface of the substrate;

(b) forming a thin liner oxide layer on the surface of the substrate; and (c) incorporating in the thin line oxide layer at least one species which substantially prevents, or at least reduces, segregation therein of the dopant species arising from movement thereinto from the at least one dopant species-containing region.

15 Claims, 2 Drawing Sheets

MAINTAINING LDD SERIES RESISTANCE OF MOS TRANSISTORS BY RETARDING DOPANT SEGREGATION

FIELD OF THE INVENTION

The present invention relates to a method for fabricating MOS transistors with LDD regions, wherein the series resistance of the LDD regions is maintained by retarding dopant segregation into an overlying liner oxide layer, and to MOS transistors obtained thereby. The method has particular utility in the manufacture of high speed integrated circuit (IC) semiconductor devices.

BACKGROUND OF THE INVENTION

The escalating requirements for high integration density and performance associated with ultra-large scale ("ULSI") integration semiconductor devices are difficult to satisfy in terms of achieving pre-selected, or desired, device characteristics, including, inter alia, drive currents and series resistance of LDD portions of source and drain regions of MOS transistors. As a consequence of such difficulty in achieving desired device characteristics, significant device rejection rates may be experienced in large-scale manufacture, leading to increased cost.

According to methodology currently employed in the manufacture of MOS transistors, a thin gate oxide layer and an overlying gate electrode layer, typically a polysilicon layer, are formed over the surface of a semiconductor substrate, followed by selective removal processing, as by anisotropic etching, to define a gate electrode/gate oxide layer stack overlying a portion of the substrate surface. LDD regions which extend for a short distance beneath the side edges of the gate electrode/gate oxide layer stack are then formed to a shallow depth in portions of the substrate not covered by the gate electrode/gate oxide layer stack, typically by implantation of dopant-containing ions, utilizing the gate electrode/gate oxide layer stack as an implantation mask. A thin liner oxide layer is then formed over the exposed portions of the substrate surface, i.e., the just-formed LDD regions, and over the side edge and top surfaces of the gate electrode/gate oxide layer stack. Insulative sidewall spacers are then formed on the portions of the thin liner oxide layer covering the side edge surfaces of the gate electrode/gate oxide layer stack and adjacent portions of the substrate surface, as by depositing a blanket layer of an electrically insulative material, e.g., a silicon oxide or nitride, over each of the exposed surfaces, followed by selectively anisotropically etching the blanket layer. More heavily-doped source and drain regions are then formed in the respective LDD regions at a deeper level below the substrate surface, as by implantation of dopant-containing ions, utilizing the gate electrode/gate oxide layer stack with sidewall spacers thereon as an implantation mask. A thermal annealing process is then performed in order to activate the implanted dopant species and effect source/drain junction formation.

A drawback associated with the above-described conventional process scheme for MOS transistor formation is the tendency for the dopant species to upwardly move from LDD regions in silicon (Si) and segregate in the overlying thin liner oxide layer, thereby resulting in dopant concentrations in the LDD regions which are less than desired or optimal. As a consequence, the series resistance of the LDD regions is greater than the design value therefor, and the device drive current is disadvantageously decreased. The effect of dopant movement from the LDD regions upwardly into the overlying thin liner oxide layer is especially significant when p-doped LDD regions are formed by implantation of boron (B) ions or indium (In) ions.

In view of the foregoing, there exists a need for methodology enabling the formation of microelectronic devices, e.g., MOS transistors and MOS transistor-based devices, such as CMOS devices, which enables a substantial and significant reduction in the tendency for dopant segregation in thin liner oxide layers overlying LDD regions, whereby disadvantageous increase in the series resistance of the LDD regions and decreased drive currents of the MOS transistors are effectively prevented, or at least minimized.

The present invention, wherein a species which effectively retards movement of dopant species from LDD regions into overlying, thin liner oxide layers, is incorporated in the thin liner oxide layers, effectively addresses and solves the problems of increased series resistance and decreased device drive current associated with the conventional MOS transistor fabrication methodology, while maintaining full compatibility with all other aspects of conventional technology for automated manufacture of microelectronic devices such as IC devices. Further, the methodology afforded by the present invention can be readily and easily implemented in cost-effective manner utilizing conventional deposition/implantation techniques. Finally, the methodology of the present invention enjoys diverse utility in the manufacture of numerous and various types of semiconductor devices and/or components.

DISCLOSURE OF THE INVENTION

An advantage of the present invention is an improved method of manufacturing a semiconductor device.

Another advantage of the present invention is an improved method of manufacturing a MOS transistor device.

Still another advantage of the present invention is an improved method of manufacturing a MOS transistor device comprising boron (B)-doped or indium (In)-doped LDD regions.

A still further advantage of the present invention is an improved semiconductor device.

A yet another advantage of the present invention is an improved MOS transistor device.

An additional advantage of the present invention is an improved MOS device comprising boron (B)-doped or indium (In)-doped LDD regions.

Additional advantages and other features of the present invention will be set forth in the description which follows and in part will become apparent to those having ordinary skill in the art upon examination of the following or may be learned from the practice of the invention. The advantages of the present invention may be realized as particularly pointed out in the appended claims.

According to an aspect of the present invention, the foregoing and other advantages are obtained in part by a method of manufacturing a semiconductor device, comprising steps of:

(a) providing a semiconductor substrate including at least one dopant species-containing region extending to a surface of the substrate;

(b) forming a thin liner oxide layer on the surface of the substrate; and (c) incorporating in the thin line oxide layer at least one species which substantially prevents, or at least reduces, segregation therein of the dopant species arising from movement thereinto from the at least one dopant species-containing region.

According to alternative embodiments of the present invention, steps (b) and (c) are performed simultaneously, or steps (b) and (c) are performed sequentially in the recited order.

In accordance with certain embodiments of the present invention, step (a) comprises providing a silicon (Si)-based semiconductor substrate including at least one p-type or n-type dopant species-containing region extending to a surface of said substrate; step (b) comprises forming a thin liner oxide layer comprised of a silicon oxide; and step (c) comprises implanting the thin liner oxide layer with ions of at least one species which substantially prevents, or at least reduces, segregation therein of the dopant species arising from movement thereinto from the at least one dopant species-containing region.

According to particular embodiments of the present invention, step (a) comprises providing a Si-based semiconductor substrate including at least one boron (B)-doped or indium (In)-doped p-type region extending to a surface of the substrate; and step (c) comprises implanting at least one of nitrogen (N)-containing and germanium (Ge)-containing ions in the thin liner oxide layer.

In accordance with preferred embodiments of the present invention, step (a) comprises providing a semiconductor substrate including:

(i) a thin gate insulator layer in overlying contact with a portion of the substrate surface;

(ii) an electrically conductive gate electrode in overlying contact with the thin gate insulator layer, the gate electrode comprising first and second opposing side surfaces and a top surface; and (iii) a pair of spaced-apart, shallow-depth, lightly-doped source and drain regions, each of the source and drain regions extending in the substrate to just beneath a respective proximal edge of the gate electrode;

step (b) comprises forming a thin conformal liner oxide layer in overlying contact with the substrate surface and the first and second opposing side surfaces and the top surface of the gate electrode; and step (c) comprises incorporating in the thin liner oxide layer ions of at least one species which substantially prevents, or at least reduces, segregation therein of dopant species arising from movement thereinto from the pair of lightly-doped source and drain regions.

According to the preferred embodiments of the invention, step (a) comprises providing a silicon (Si)-based substrate; the thin gate insulator layer (i) comprises a silicon oxide layer, a silicon nitride layer, or a silicon nitride/silicon oxide layer stack; the electrically conductive gate electrode (ii) comprises polysilicon; and step (b) comprises forming a thin conformal liner oxide layer comprising a silicon oxide; wherein: step (a) comprises providing a Si substrate wherein the pair of spaced-apart, shallow-depth, lightly-doped source and drain regions are boron (B)-doped or indium (In)-doped p-type regions; and step (c) comprises incorporating at least one of nitrogen (N)-containing and germanium (Ge)-containing ions in the thin liner oxide layer.

According to particular embodiments of the present invention, step (b) comprises forming the thin conformal liner oxide layer to a thickness from about 40 to about 400 Å; and step (c) comprises implanting at least one of nitrogen (N)-containing and germanium (Ge)-containing ions in the thin liner oxide layer, e.g., step (c) comprises implanting at least one of nitrogen (N)-containing and germanium (Ge)-containing ions at energies between about 1 and about 15 KeV and dosages between about $5\times10^{14}/cm^2$ and $3\times10^{15}/cm^2$, depending upon the liner oxide thickness and implantation species.

Another aspect of the present invention is a method of manufacturing a MOS transistor, comprising steps of:

(a) providing a semiconductor substrate having a surface and including:

(i) a thin gate insulator layer in overlying contact with a portion of the substrate surface;

(ii) an electrically conductive gate electrode in overlying contact with the thin gate insulator layer, the gate electrode comprising first and second opposing side surfaces and a top surface; and (iii) a pair of spaced-apart, shallow-depth, lightly-doped source and drain extension regions, each of the source and drain extension regions extending in the substrate to just beneath a respective proximal edge of the gate electrode;

(b) forming a thin conformal liner oxide layer in overlying contact with the substrate surface and the first and second opposing side surfaces and the top surface of the gate electrode; and (c) incorporating in the thin liner oxide layer at least one species which substantially prevents, or at least reduces, segregation therein of dopant species arising from movement thereinto from the pair of source and drain extension regions.

According to embodiments of the present invention, the method further comprises steps of:

(d) forming insulative sidewall spacers on the first and second opposing side surfaces of the gate electrode;

(e) forming deeper, more heavily-doped source and drain regions below the respective shallow-depth, lightly-doped source and drain extension regions; and (f) thermally annealing the source and drain regions to activate dopant species therein and effect source and drain junction formation.

In accordance with certain embodiments of the invention, step (e) comprises forming the deeper, more heavily-doped source and drain regions by dopant ion implantation using the insulative sidewall spacers as implantation masks.

According to preferred embodiments of the present invention, step (a) comprises providing a silicon (Si)-based substrate; the thin gate insulator layer (i) comprises a silicon oxide layer, a silicon nitride layer, or a silicon nitride/silicon oxide layer stack; the electrically conductive gate electrode (ii) comprises polysilicon; the pair of spaced-apart, shallow-depth, lightly-doped source and drain extension regions (iii) are boron (B)-doped or indium (In)-doped p-type regions; step (b) comprises forming a thin conformal liner oxide layer comprising a silicon oxide; and step (c) comprises incorporating at least one of nitrogen (N)-containing and germanium (Ge)-containing ions in the thin liner oxide layer; e.g., step (b) comprises forming the thin conformal liner oxide layer to a thickness from about 40 to about 400 Å; and step (c) comprises implanting at least one of nitrogen (N)-containing and germanium (Ge)-containing ions in the thin liner oxide layer at energies between about 1 and about 15 KeV and dosages between about $5\times10^{14}/cm^2$ and $3\times10^{15}/cm^2$.

Yet another aspect of the present invention is a semiconductor device, comprising:

(a) a semiconductor substrate including at least one dopant species-containing region extending to a surface of the substrate; and (b) a thin liner oxide layer on the surface of the substrate, wherein the thin line oxide layer includes at least one species which substantially prevents, or at least reduces, segregation therein of the dopant species arising from movement thereinto from the at least one dopant species-containing region.

According to embodiments of the present invention, the semiconductor substrate (a) is a silicon (Si)-based substrate, the at least one dopant species-containing region is a boron (B)-doped or indium (In)-doped p-type region; the thin liner oxide layer (b) is a silicon oxide layer, and the at least one species which substantially prevents, or at least reduces, segregation therein of the dopant species arising from movement thereinto from the at least one dopant species-containing region is at least one of nitrogen (N)-containing and germanium (Ge)-containing species.

In accordance with preferred embodiments of the present invention, the semiconductor device is a MOS transistor and the semiconductor substrate (a) includes:

(i) a thin gate insulator layer in overlying contact with a portion of the substrate surface;

(ii) an electrically conductive gate electrode in overlying contact with the thin gate insulator layer, the gate electrode comprising first and second opposing side surfaces and a top surface; and (iii) a pair of spaced-apart, shallow-depth, lightly boron (B)-doped or indium (In)-doped source and drain extension regions, each of the source and drain extension regions extending in the substrate to just beneath a respective proximal edge of the gate electrode; and the thin liner oxide layer (b) is a conformal layer in overlying contact with the substrate surface and the first and second opposing side surfaces and the top surface of the gate electrode; wherein the semiconductor substrate (a) further includes:

(iv) deeper, more heavily-doped source and drain regions below the respective shallow-depth, lightly-doped source and drain extension regions; and insulative sidewall spacers on the first and second opposing side surfaces of the gate electrode.

Additional advantages and aspects of the present invention will become apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the relevant features are not necessarily drawn to scale but rather are drawn as to best illustrate the pertinent features, and in which like reference numerals are employed throughout to designate similar features, wherein.

DESCRIPTION OF THE INVENTION

The present invention is based upon recognition that the disadvantageous, deleterious segregation of dopant species from LDD regions of MOS transistor precursor structures by movement into overlying thin liner oxide layers, can be substantially and significantly reduced, if not entirely eliminated, by incorporating in the thin liner oxide layer a species which reduces, or substantially prevents, segregation of the dopant species therein.

A key feature of the present invention, therefore, is the incorporation of the dopant segregation preventative or inhibitive species in the thin liner oxide layer simultaneously with or subsequent to formation of the latter. In either instance, incorporation of the dopant segregation preventative or inhibitive species is performed prior to processing for forming heavier-doped, deeper level source/drain regions, e.g., by implantation and thermal annealing for dopant activation and source/drain junction formation. The inventive process methodology effectively addresses and remediates problems of decreased device drive currents and increased LDD series resistance arising from dopant segregation in overlying thin liner oxide layers of MOS transistor devices, while maintaining full compatibility with all other aspects of conventional techniques and methodologies for automated manufacture of microelectronic devices such as IC devices. Further, the methodology afforded by the present invention can be readily and easily implemented in cost-effective manner utilizing conventional techniques, e.g., chemical vapor deposition (CVD) and ion implantation. Finally, the inventive methodology enjoys diverse utility in the manufacture of numerous and various types of semiconductor devices, including, inter alia, MOS transistors and CMOS devices and/or components.

An embodiment of the present invention will now be described with respect to FIGS. 1(A)–1(F) which illustrate, in simplified, cross-sectional, schematic form, sequential steps in performing a process for manufacturing a MOS transistor according to the invention.

The term "semiconductor substrate", as employed throughout the present disclosure and claims, denotes a semiconductor wafer, e.g., a monocrystalline silicon (Si) wafer, or an epitaxial semiconductor layer, e.g., an epitaxial Si layer, formed on a semiconductor substrate 1 comprising at least one region 1' of a first conductivity type. It will be appreciated that for P-MOS transistors, region 1' is n-type and for N-MOS transistors, region 1' is p-type. It is further understood that the substrate 1 may comprise pluralities of n- and p-type regions arrayed in a desired pattern, as, for example, in CMOS devices.

Figure 1A:
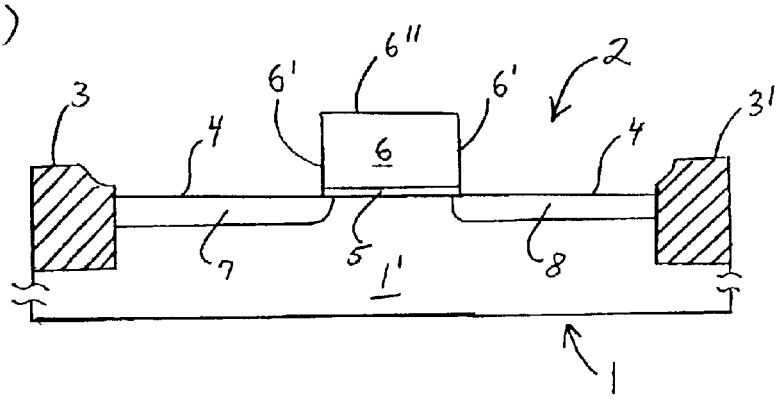
FIGS. 1(A)–1(F) illustrate, in simplified, cross-sectional, schematic form, sequential steps in performing a process for manufacturing a MOS transistor according to the inventive methodology.

Referring more particularly to FIG. 1(A), as indicated supra, reference numeral 1' indicates a region or portion of a semiconductor substrate 1 (illustratively a Si substrate) of a first conductivity type (p or n), fabricated as a MOS transistor precursor 2. Precursor 2 is processed, as by conventional techniques not described herein in detail in order to not unnecessarily obscure the primary significance of the following description, and comprises a plurality of, illustratively two, isolation regions 3 and 3' of a silicon oxide, e.g., shallow trench isolation (STI) regions, each extending from the surface 4 of substrate 1 to a desired depth below the surface. A gate insulator layer segment 5, typically comprising a silicon oxide layer or a nitride/oxide stacked layer up to about 100 Å thick, is formed on a portion of substrate surface 4. Electrically conductive gate electrode 6, typically of a heavily-doped polysilicon, is formed to a suitable thickness over the gate insulator layer segment 5, e.g., about 1,000–1,500 Å, and comprises opposing side surfaces 6', 6' and top surface 6". A pair of lightly-doped, shallow-depth source and drain extension regions ("LDD" regions) 7, 8 are formed by implantation of ions (using the gate electrode/gate insulator segment 6/5 as an implantation mask) of at least one p-type dopant species selected from e.g., boron (B), gallium (Ga), and indium (In) or at least one n-type dopant species selected from phosphorus (P), arsenic (As), and antimony (Sb), and extend within substrate portion 1' from just beneath respective side edges 6', 6' of gate electrode 6 to isolation regions 3 and 3'.

Figure 1B:
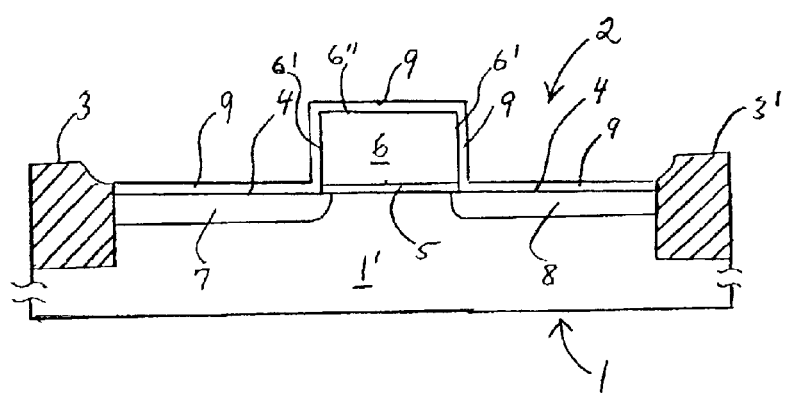

Adverting to FIG. 1(B), a thin, conformal layer 9 of an insulative liner oxide material, e.g., an about 40 to about 400 Å thick layer of a silicon oxide formed by chemical vapor deposition (CVD) or plasma enhanced chemical vapor deposition (PECVD), is formed over the exposed portions of the substrate surface 4, including the side edges 6', 6' and top surface 6" of the gate electrode 6 for, inter alia, preventing out-diffusion of dopant ions from the gate electrode 6 and for functioning as an etch stop layer in a subsequent etching of an overlying blanket silicon nitride layer (vide infra) for defining sidewall spacers.

Segregation of dopant species, illustratively, but not limitatively, p-type dopant species comprised of boron (B)-containing ions and indium (In)-containing ions, in oxide liner layers (e.g., layer 9) overlying LDD source/drain extension regions (e.g., 7, 8) containing such dopants, poses significant problems in the manufacture of Si-based MOS transistors, for reasons described in detail supra. According to the invention, at least one species which prevents, reduces, or otherwise limits such segregation in liner oxide layers of dopant species originating in neighboring doped layers or regions, e.g., underlying source/drain extension regions 7, 8 is incorporated in the thin liner oxide layer 9. For example, nitrogen (N)-containing species and/or germanium (Ge)-containing species may be incorporated in thin liner oxide layers of silicon oxide for preventing, or at least mitigating, segregation of dopant-containing species therein, e.g., p-type dopant species such as boron (B)-containing ions and indium (In)-containing ions.

According to an embodiment of the present invention, the species which prevents or at least mitigates dopant species segregation in the thin liner oxide layer (9) is incorporated therein simultaneously with its formation. By way of illustration, but not limitation, formation of a nitrogen-incorporated silicon oxide liner layer 9 may be accomplished by placing substrate/workpiece 1 in a chamber with an interior space maintained at an elevated temperature, e.g., from about 400 to about 900° C., containing an atmosphere including oxygen ($O_2$) gas and a nitrogen-bearing impurity, such as nitrogen ($N_2$) gas, a nitrogen oxide such as NO or $N_2O$, or ammonia ($NH_3$).

Figure 1C:
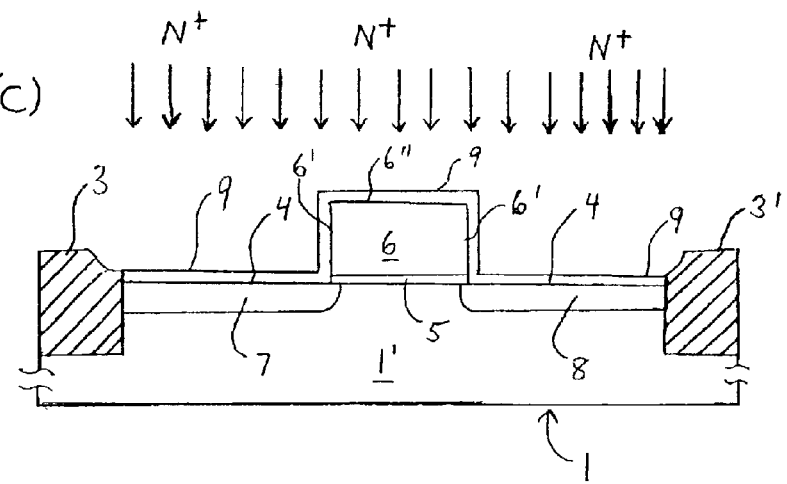

According to another embodiment of the present invention, shown in FIG. 1(C), incorporation of at least one species which substantially prevents, or at least reduces, disadvantageous/deleterious segregation of dopant species in the thin liner oxide layer 9 arising from movement thereinto of dopant species from the underlying LDD source and drain extension regions 7, 8 during subsequent processing, e.g., thermal annealing for dopant activation and source/drain junction formation, is accomplished subsequent to formation of the thin liner oxide layer 9, as by ion implantation. By way of illustration, but not limitation, implantation of ions of at least one of a nitrogen (N)-containing species and a germanium (Ge)-containing species, e.g., at energies between about 1 and about 15 KeV and dosages between about $5 \times 10^{14}/cm^2$ and $3 \times 10^{15}/cm^2$, is effective for preventing or inhibiting, thus limiting, segregation of boron (B)-containing and/or indium (In)-containing p-type dopant species in thin liner oxide layer 9.

Figure 1D:
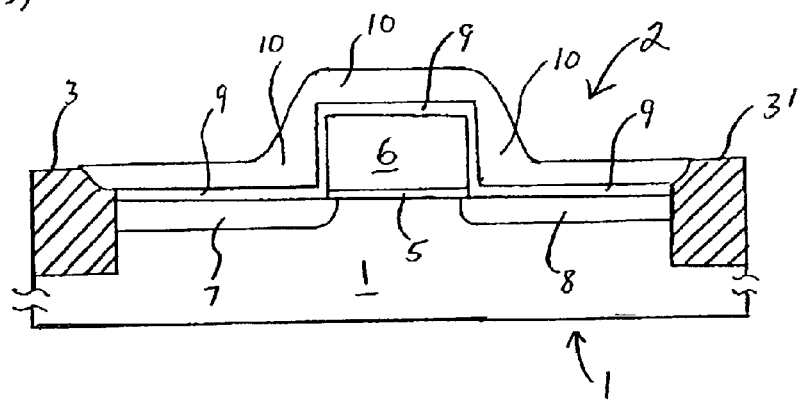

Referring to FIG. 1(D), a relatively thick, conformal blanket layer 10 of an insulative material, e.g., a silicon nitride, is then formed to cover all exposed surfaces of the thin liner oxide layer 9. By way of illustration only, formation of the silicon nitride blanket layer 10 may be accomplished by decomposing silane ($SiH_4$) and ammonia ($NH_3$) gases in a CVD reactor chamber maintained at a temperature in the range from about 250 to about 800° C. and an interior pressure of less than about 2 Torr. The thickness of blanket insulative layer 10 is selected so as to provide, in a subsequent step, sidewall spacers of desired height, width, and tapered cross-sectional profile on each of the opposing side edge surfaces 6', 6' of gate electrode 6. Illustratively, blanket insulative layer 10 is formed to a thickness of about 800–1, 000 Å.

Figure 1E:
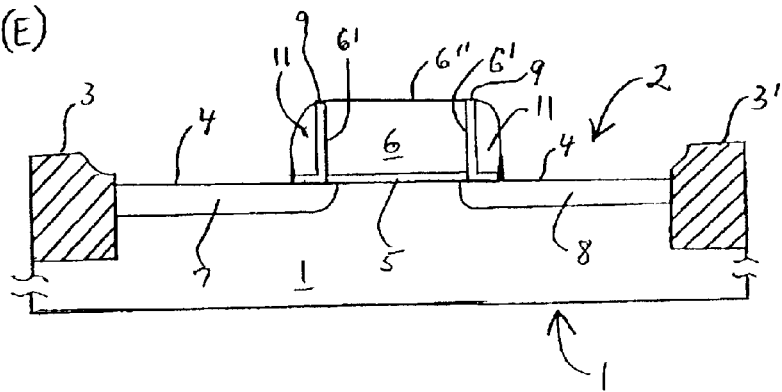

With reference to FIG. 1(E), sidewall spacers 11, 11 are then formed on the opposing side edges 6', 6' of gate electrode 6, as by selective anisotropic etching of the blanket insulative layer 10 and underlying thin liner oxide layer 9, the selective anisotropic etching process typically comprising plasma etching in a halogen-containing atmosphere to remove horizontally-oriented portions thereof overlying the top surface 6" of the gate electrode 6 and regions of the substrate surface 4 where source/drain regions 12, 13 are to be later formed (vide infra).

Figure 1F:
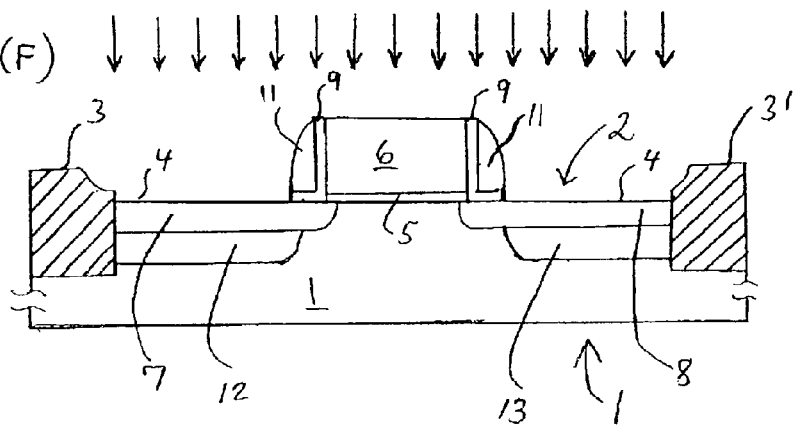

Adverting to FIG. 1(F), in a next step according to the invention, a pair of more heavily-doped source and drain junction regions 12, 13 are formed beneath the respective lightly-doped, shallow-depth source and drain extension regions 7, 8, as by implantation of dopant-containing ions (e.g., B-containing or In-containing ions according to the illustrated embodiment), using the gate electrode/gate insulator segment 6/5 with sidewall spacers 11, 11 formed on the side edges thereof as an implantation mask. Implantation energies and dosages utilized for forming source and drain regions 12, 13 are greater than those employed for implantation of the LDD source/drain extension regions 7, 8, typically from about 0.2 to about 5 KeV and from about $1 \times 10^{14}$ to about $6 \times 10^{15}$ ions/$cm^2$, respectively.

Following implantation of the heavily-doped source and drain junction regions 12, 13, substrate/workpiece 1 is subjected to annealing, e.g., furnace annealing for about 60 min. at about 900 to about 1,100° C., or rapid thermal annealing (RTA) for up to about 60 sec. at about 950 to about 1,100° C. to activate the dopant-containing impurities therein and form source and drain junctions between regions 12, 13 and substrate 1.

According to the invention, disadvantageous/deleterious segregation of dopant-containing ions in the remaining portions of the thin liner oxide layer 9 arising from movement thereinto of dopant-containing ions from the LDD source/drain extension regions 7, 8 upon processing at elevated temperatures, e.g., during the above thermal annealing for dopant activation+source/drain junction formation, is substantially prevented, or at least minimized by the presence of the segregation retarding/inhibiting species introduced into the thin liner oxide layer during earlier processing. Stated differently, the inventive methodology ensures that depletion of dopant-containing species from the LDD source/drain regions resulting from segregation in the respective overlying portions of thin liner oxide layer 9 is prevented, or at least minimized. As a consequence, series resistances of the LDD source/drain extension regions 7, 8 is maintained at or near the design values throughout the device processing sequence, and maximum or optimal device drive currents at or near the design values are obtained.

Thus, the present invention-facilitates formation of high quality MOS transistors and CMOS devices with LDD source/drain extension regions having low (i.e., design) resistances and enhanced drive currents, by providing a significant and substantial reduction in segregation of dopant-containing species in overlying portions of thin liner oxide layers. Advantageously, the inventive methodology can be practiced in cost-effective manner at rates consistent with the throughput requirements of automated manufacturing process flow for the manufacture of semiconductor IC devices and/or components thereof.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, comprising steps of:
   (a) providing a semiconductor substrate including at least one dopant species-containing region extending to a surface of said substrate;
   (b) forming a thin liner oxide layer on said surface of said substrate; and
   (c) incorporating in said thin liner oxide layer at least one species which substantially prevents, or at least reduces, segregation therein of said dopant species arising from movement thereinto from said at least one dopant species-containing region.

2. The method as in claim 1, wherein:
   steps (b) and (c) are performed simultaneously.

3. The method as in claim 1, wherein:
   steps (b) and (c) are performed sequentially in the recited order.

4. The method as in claim 1, wherein:
   step (a) comprises providing a silicon (Si)-based semiconductor substrate including at least one p-type or n-type dopant species-containing region extending to a surface of said substrate;
   step (b) comprises forming a thin liner oxide layer comprised of a silicon oxide; and
   step (c) comprises implanting said thin liner oxide layer with ions of at least one species which substantially prevents, or at least reduces, segregation therein of said dopant species arising from movement thereinto from said at least one dopant species-containing region.

5. The method as in claim 4, wherein:
   step (a) comprises providing a Si-based semiconductor substrate including at least one boron (B)-doped or indium (In)-doped p-type region extending to a surface of said substrate; and
   step (c) comprises implanting at least one of nitrogen (N)-containing and germanium (Ge)-containing ions in said thin liner oxide layer.

6. The method as in claim 1, wherein:
   step (a) comprises providing a semiconductor substrate including:
   (i) a thin gate insulator layer in overlying contact with a portion of said substrate surface;
   (ii) an electrically conductive gate electrode in overlying contact with said thin gate insulator layer, said gate electrode comprising first and second opposing side surfaces and a top surface; and
   (iii) a pair of spaced-apart, shallow-depth, lightly-doped source and drain regions, each of said source and drain regions extending in said substrate to just beneath a respective proximal edge of said gate electrode;
   step (b) comprises forming a thin conformal liner oxide layer in overlying contact with said substrate surface and said first and second opposing side surfaces and said top surface of said gate electrode; and
   step (c) comprises incorporating in said thin liner oxide layer ions of at least one species which substantially prevents, or at least reduces, segregation therein of dopant species arising from movement thereinto from said pair of lightly-doped source and drain regions.

7. The method as in claim 6, wherein:
   step (a) comprises providing a silicon (Si)-based substrate;
   said thin gate insulator layer (i) comprises a silicon oxide layer, a silicon nitride layer, or a silicon nitride/silicon oxide layer stack;
   said electrically conductive gate electrode (ii) comprises polysilicon; and
   step (b) comprises forming a thin conformal liner oxide layer comprising a silicon oxide.

8. The method as in claim 7, wherein:
   step (a) comprises providing a Si substrate wherein said pair of spaced-apart, shallow-depth, lightly-doped source and drain regions are boron (B)-doped or indium (In)-doped p-type regions; and
   step (c) comprises incorporating at least one of nitrogen (N)-containing and germanium (Ge)-containing ions in said thin liner oxide layer.

9. The method as in claim 8, wherein:
   step (b) comprises forming said thin conformal liner oxide layer to a thickness from about 40 to about 400 Å; and
   step (c) comprises implanting at least one of nitrogen (N)-containing and germanium (Ge)-containing ions in said thin liner oxide layer.

10. The method as in claim 9, wherein:
    step (c) comprises implanting at least one of nitrogen (N)-containing and germanium (Ge)-containing ions at energies between about 1 and about 15 KeV and dosages between about $5 \times 10^{14}/cm^2$ and $3 \times 10^{15}/cm^2$.

11. A method of manufacturing a MOS transistor, comprising steps of:
    (a) providing a semiconductor substrate having a surface and including:
    (i) a thin gate insulator layer in overlying contact with a portion of said substrate surface;
    (ii) an electrically conductive gate electrode in overlying contact with said thin gate insulator layer, said gate electrode comprising first and second opposing side surfaces and a top surface; and
    (iii) a pair of spaced-apart, shallow-depth, lightly-doped source and drain extension regions, each of said source and drain extension regions extending in said substrate to just beneath a respective proximal edge of said gate electrode;
    (b) forming a thin conformal liner oxide layer in overlying contact with said substrate surface and said first and second opposing side surfaces and said top surface of said gate electrode; and (c) incorporating in said thin liner oxide layer at least one species which substantially prevents, or at least reduces, segregation therein of dopant species arising from movement thereinto from said pair of source and drain extension regions.

12. The method as in claim 11, further comprising steps of:

(d) forming insulative sidewall spacers on said first and second opposing side surfaces of said gate electrode;

(e) forming deeper, more heavily-doped source and drain regions below the respective shallow-depth, lightly-doped source and drain extension regions; and (f) thermally annealing said source and drain regions to activate dopant species therein and effect source and drain junction formation.

13. The method as in claim 12, wherein:

step (e) comprises forming said deeper, more heavily-doped source and drain regions by dopant ion implantation using said insulative sidewall spacers as implantation masks.

14. The method as in claim 12, wherein:

step (a) comprises providing a silicon (Si)-based substrate;

said thin gate insulator layer (i) comprises a silicon oxide layer, a silicon nitride layer, or a silicon nitride/silicon oxide layer stack;

said electrically conductive gate electrode (ii) comprises polysilicon;

said pair of spaced-apart, shallow-depth, lightly-doped source and drain extension regions (iii) are boron (B)-doped or indium (In)-doped p-type regions;

step (b) comprises forming a thin conformal liner oxide layer comprising a silicon oxide; and step (c) comprises incorporating at least one of nitrogen (N)-containing and germanium (Ge)-containing ions in said thin liner oxide layer.

15. The method as in claim 14, wherein:

step (b) comprises forming said thin conformal liner oxide layer to a thickness from about 40 to about 400 Å; and step (c) comprises implanting at least one of nitrogen (N)-containing and germanium (Ge)-containing ions in said thin liner oxide layer at energies between about 1 and about 15 KeV and dosages between about $5 \times 10^{14}/cm^2$ and $3 \times 10^{15}/cm^2$.

* * * * *